US009412639B2

(12) United States Patent
Siefering et al.

(10) Patent No.: US 9,412,639 B2
(45) Date of Patent: Aug. 9, 2016

(54) METHOD OF USING SEPARATE WAFER CONTACTS DURING WAFER PROCESSING

(71) Applicant: TEL FSI, Inc., Chaska, MN (US)

(72) Inventors: Kevin L. Siefering, Excelsior, MN (US); David DeKraker, Burnsville, MN (US)

(73) Assignee: TEL FSI, INC., Chaska, MN (US)

( * ) Notice: Subject to any disclaimer, the term of this patent is extended or adjusted under 35 U.S.C. 154(b) by 0 days.

(21) Appl. No.: 14/562,386

(22) Filed: Dec. 5, 2014

(65) Prior Publication Data

US 2015/0162207 A1    Jun. 11, 2015

Related U.S. Application Data

(60) Provisional application No. 61/913,080, filed on Dec. 6, 2013.

(51) Int. Cl.
| H01L 21/687 | (2006.01) |
| H01L 21/67 | (2006.01) |
| H01L 21/02 | (2006.01) |

(52) U.S. Cl.
CPC .... *H01L 21/68728* (2013.01); *H01L 21/67051* (2013.01); *H01L 21/02087* (2013.01)

(58) Field of Classification Search
None
See application file for complete search history.

(56) References Cited

U.S. PATENT DOCUMENTS

| 5,931,518 A * | 8/1999 | Pirker | H01L 21/68707 294/119.1 |
| 5,988,971 A | 11/1999 | Fossey et al. | |
| 2006/0219258 A1* | 10/2006 | Gast | H01L 21/02063 134/2 |
| 2014/0251375 A1* | 9/2014 | Holden | H01L 21/02076 134/7 |
| 2014/0331927 A1* | 11/2014 | Nakano | H01L 21/00 118/641 |

FOREIGN PATENT DOCUMENTS

| JP | 4-186626 | 7/1992 | |
| JP | 4-311034 | 11/1992 | |
| JP | EP 1037261 A2 * | 9/2000 | B08B 3/02 |
| JP | 2013-187490 | 9/2013 | |

* cited by examiner

*Primary Examiner* — Anita Alanko
(74) *Attorney, Agent, or Firm* — Kagan Binder, PLLC

(57) ABSTRACT

Embodiments of the invention are directed towards improving on-wafer process performance and processing at increased processing fluid/wafer temperature while maintaining good process performance. A method for processing a wafer in a process chamber is described where the process chamber includes a wafer holder having first and second sets of edge grippers for independently securing the wafer at the wafer edge during processing, treating the wafer with a first processing fluid while securing the wafer with the first set of edge grippers, but not with the second set of edge grippers, treating the wafer with a second processing fluid while securing the wafer with the first set of edge grippers, but not with the second set of edge grippers, and treating the wafer with a third processing fluid while securing the wafer with the second set of edge grippers, but not with the first set of edge grippers.

7 Claims, 2 Drawing Sheets

METHOD OF USING SEPARATE WAFER CONTACTS DURING WAFER PROCESSING

CROSS-REFERENCE TO RELATED APPLICATIONS

Pursuant to 37 CFR §1.78(a)(4), this application claims the benefit of and priority to U.S. Provisional Application Ser. No. 61/913,080, filed on Dec. 6, 2013, the entire content of which is herein incorporated by reference.

FIELD OF INVENTION

The present invention relates to the field of processing semiconductor wafers, and more particularly to a method of rinsing a processing solution from a wafer that is releasably gripped by its edges by edge grippers.

BACKGROUND OF THE INVENTION

In many single wafer or batch spray wafer processing systems, processing solutions (e.g., etching solutions or rinsing solutions) are used to treat a wafer during various processing steps. During processing, it is desirable that the wafer handling apparatus be capable of providing a high wafer throughput while maintaining careful and precise handling of each individual wafer. The wafer is often releasably gripped by its edges by edge grippers to secure the wafer and minimize contamination of the top and bottom wafer surfaces. However, a small amount of processing solution and residue can become trapped between the edge grippers and the edge of the wafer. This small amount of processing solution and other residue can be hard to remove during subsequent rinse steps and can wick out onto the wafer surface and can cause contamination in areas near the wafer edge contacted by the edge gripper.

Accordingly, new methods are required to address these contamination problems.

SUMMARY OF THE INVENTION

A method for processing a wafer in a process chamber is described where the process chamber includes a wafer holder having first and second sets of edge grippers for independently securing the wafer at the wafer edge during processing. The method further includes treating the wafer with a first processing fluid while securing the wafer with the first set of edge grippers, but not with the second set of edge grippers, and treating the wafer with a second processing fluid while securing the wafer with the first set of edge grippers, but not with the second set of edge grippers, and treating the wafer with a third processing fluid while securing the wafer with the second set of edge grippers, but not with the first set of edge grippers.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Embodiments of the invention include methods to improve on-wafer process performance (e.g., reduced particle contamination) and to allow processing at high processing fluid/wafer temperature while maintaining good process performance.

Figure 1:
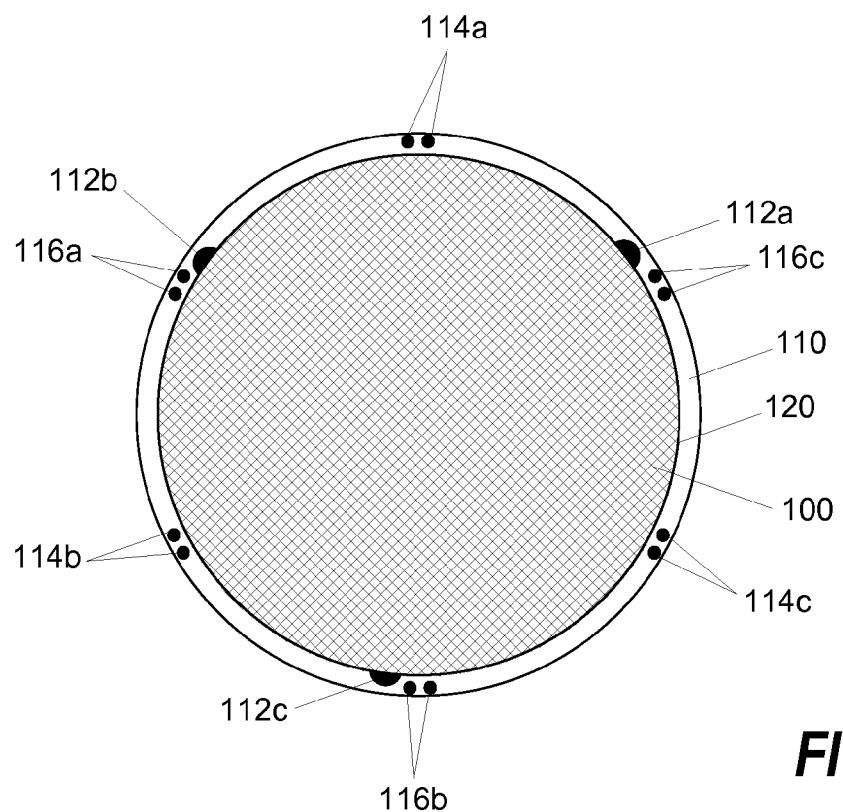
FIGS. 1-4 schematically show a top view of a wafer positioned on a wafer holder containing edge grippers according to an embodiment of the invention.

FIG. 1 schematically shows a top view of a wafer positioned on a wafer holder containing edge grippers according to an embodiment of the invention. The wafer holder (chuck) contains a PTFE Teflon ™ chuck cover 110. The wafer 100 rests on wafer supports 112a, 112b, 112c when it is not gripped by the edge grippers (pins). The act of gripping lifts the wafer 100 of the wafer supports 112a, 112b, 112c so that only the edge 120 of the wafer 100 is contacted by the gripping.

In the exemplary embodiment schematically shown in FIG. 1, a total of 6 gripping locations are symmetrically placed around the perimeter of the wafer edge 120. A first set of edge grippers 114a, 114b, 114c (located at 120 degree angle separation) are actuated separately from a second set of three edge grippers 116a, 116b, 116c, so that the wafer 100 can be gripped by neither set edge grippers, either one of the set of edge grippers, or both sets of edge grippers. Each grip location has two grippers so that if one of the grippers lands on the wafer positioning notch (not shown), the other gripper still grips the edge 120 of the wafer 100. The grippers are actuated in (towards the wafer edge 120) or activated out (away from the wafer edge 120) by a lever/spring mechanism inside the substrate holder (chuck) under the chuck cover 110. FIG. 1 shows the situation where all edge grippers are disengaged and the wafer 100 rests on the wafer supports 112a, 112b, 112c.

Figure 2:
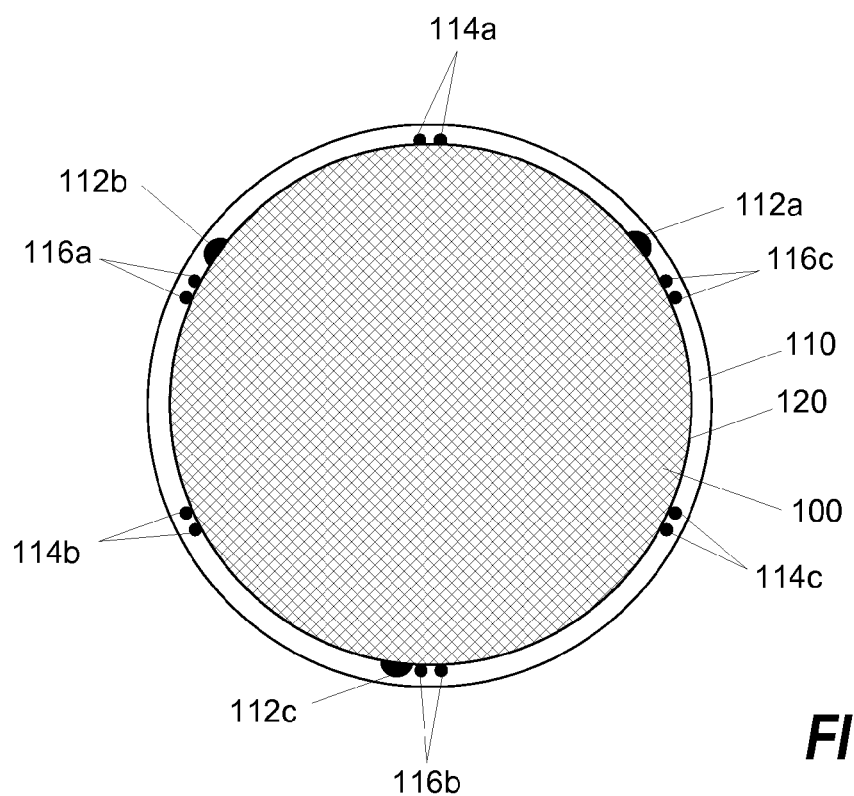

FIG. 2 shows the situation where all the edge grippers are engaged and the wafer 100 is secured by the first set of edge grippers 114a, 114b, 114c and by the second set of edge grippers 116a, 116b, 116c.

Figure 3:
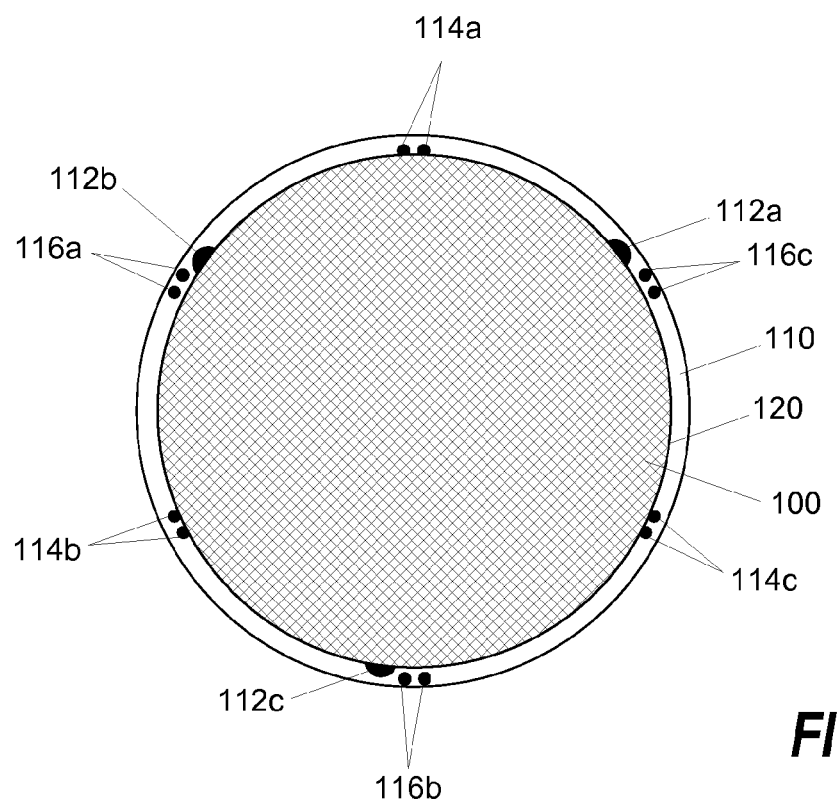

FIG. 3 shows the situation where only the first set of edge grippers 114a, 114b, 114c are engaged and secure the wafer 100.

Figure 4:
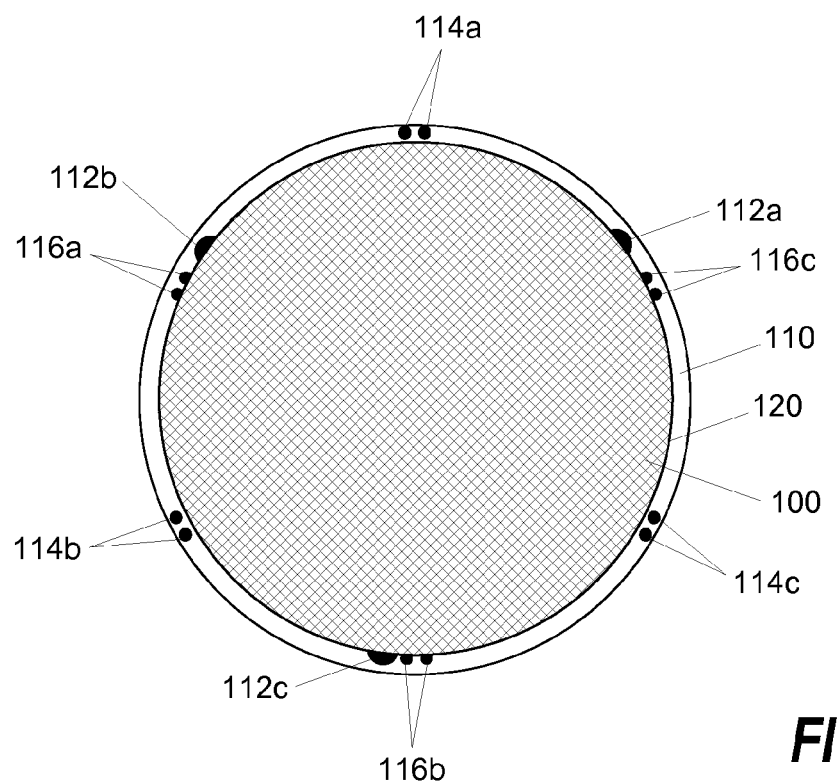

FIG. 4 shows the situation where only the second set of edge grippers 116a, 116b, 116c are engaged and secure the wafer 100.

The presence of the first and second sets of edge grippers allows for improving process performance by using the first set of edge grippers 114a, 114b, 114c to secure the wafer 100 for certain process steps and the second set of edge grippers 116a, 116b, 116c for secure the wafer for other process steps.

The inventors have observed that following a wafer treatment with a first processing fluid (e.g., an etching solution), a small amount of processing fluid or residue can become trapped in an area between an edge gripper securing the wafer and the edge of the wafer. This processing fluid or residue is hard to remove from this area by rinsing using a second processing fluid during subsequent rinsing steps and the processing fluid or residue can wick out of this area onto the top and/or bottom wafer surfaces and cause wafer surface contamination near the edge gripper location. This wafer surface contamination can appear as a particle contamination (signature) in subsequent metrology examination of the processed wafer. This kind of wafer surface contamination has been observed to be a severe problem when using sulfuric acid or sulfuric acid mixtures as a processing fluid because of the difficulty of removing the sulfuric acid by rinsing and because of the wicking properties of sulfuric acid.

Referring now to FIG. 3, according to one embodiment of the invention, the above-described problem of wafer surface contamination can be reduced or eliminated by using the first set of edge grippers 114a, 114b, 114c to secure the wafer 100 during a sulfuric acid processing step, while leaving the second set of edge gripper 116a, 116b, 116c not engaged (ungripped) with the wafer edge 120. This processing step can result in sulfuric acid becoming trapped between the wafer edge 120 and the first set of edge grippers 114a, 114b, 114c. A first rinse step can then be performed for removing the sulfuric acid from the wafer top surface, the wafer edge 120, and the surfaces of the second edge grippers 116a, 116b, 116c pins that are ungripped.

Thereafter, as depicted in FIG. 4, the second set of edge grippers 116a, 116b, 116c can be engaged to secure the wafer 100, and the first set of edge grippers 114a, 114b, 114c released (ungripped) from the wafer edge 120. A second rinse step may then be performed to rinse the sulfuric acid contamination from the area near the wafer edge 120 where the first set of edge grippers 114a, 114b, 114c had made contact. Thus, the second rinse step can rinse both the wafer edge 120 and the wafer edge contact surfaces of the first set of edge grippers 114a, 114b, 114c. This processing method can result in wafer processing improvements that include reduced particle counts on the wafer surface, in particular near the contact points between the wafer edge 120 and the gripper pins, and reduced rinse time which can allow higher wafer throughput and reduced rinse fluid consumption. In one example, the same type of rinsing solution (e.g., SC1) may be used in the first and second rinse steps. In another example, different types of rinsing solutions may be used in the first and second rinse steps.

According to another embodiment, a method is presented that enables high temperature processing, including utilizing high processing fluid temperature and/or high wafer temperature while maintaining good process performance. A commonly used material for edge gripper pins is perfluoro alkoxy copolymer (PFA), a variation of Teflon®. The inventors have realized that over time when using high processing temperatures, the PFA in the edge gripper pins is gradually dented more and more by the gripping contact force on the wafer edge. This increases the contact area between the edge gripper and the wafer edge, increases the entrapment of processing fluid and residues within the contact area, and ultimately leads to contamination of the wafer top and/or bottom surfaces.

There is therefore a need to find and use a material that has better mechanical properties than conventional PFA at very high temperatures when used as an edge gripper contact material. The inventors tested carbon fiber loaded PFA material, which has better thermal properties and can tolerate higher temperatures than PFA. Experiments that were carried using the carbon fiber loaded PFA material showed wafer surface contamination following exposure to a processing fluid and a subsequent rinsing step. The inventors speculate that the surface contamination may be due to either a higher tendency of carbon fiber loaded PFA material to trap contamination with the carbon fibers exposed, or that the fibers themselves may be a contamination source.

The inventors have realized that the above-described wafer holder with first and second sets of edge grippers may be used to reduce or eliminate wafer surface contamination while using different materials for the first and second set of edge grippers. In one example, the different materials can include PFA and carbon fiber loaded PFA. In one example, the carbon fiber loaded PFA material (higher temperature material) may be used in the first set of edge grippers for a higher temperature process (e.g., sulfuric acid treatment), and PFA used in the second set of edge grippers for a lower temperature process (e.g. a rinsing process). Thus, a second rinse, as well as any subsequent rinsing steps (e.g., SC1 rinsing), would remove the sulfuric acid and residues as well as any possible carbon fiber contamination from the contact areas of the first set of edge grippers and the wafer edge. This allows for wafer processing using higher temperatures than when using PFA material in the first and second sets of edge grippers, and can result in longer lifetime of the edge gripper material at high temperatures.

A plurality of embodiments for improving on-wafer process performance (e.g., reduced particle contamination) and improving processing at increased processing fluid/wafer temperature while maintaining good process performance have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for processing a wafer in a process chamber, the process chamber including a wafer holder having first and second sets of edge grippers for independently securing the wafer at the wafer edge during processing, the method comprising:
   treating the wafer with a first processing conditions while securing the wafer with the first set of edge grippers, but not with the second set of edge grippers; and
   treating the wafer with a second processing conditions while securing the wafer with the second set of edge grippers, but not with the first set of edge grippers;
   wherein a material of the first set of edge grippers that contacts the edge of the wafer is different than a material of the second set of edge grippers that contacts the edge of the wafer.

2. The method of claim 1, wherein the first processing conditions is a higher temperature process than that of the second processing conditions, and the material of the first set of edge grippers that contacts the edge of the wafer can tolerate a higher temperature than the material of the second set of edge grippers that contacts the edge of the wafer.

3. The method of claim 1, wherein the material of the first set of edge grippers that contacts the edge of the wafer includes carbon fiber enforced perfluoro alkoxy copolymer (PFA) and the material of the second set of edge grippers that contacts the edge of the wafer consists of PFA.

4. The method of claim 1, wherein the first processing conditions comprises treating the wafer with a first processing fluid that contains an acid solution while securing the wafer with the first set of edge grippers, but not with the second set of edge grippers; and
   the second processing conditions comprises treating the wafer with a second processing fluid that contains a rinsing solution while securing the wafer with the second set of edge grippers, but not with the first set of edge grippers.

5. The method of claim 4, wherein the material of the first set of edge grippers that contacts the edge of the wafer includes carbon fiber enforced PFA and the material of the second set of edge grippers that contacts the edge of the wafer consists of PFA.

6. The method of claim 1, wherein the first set of edge grippers includes three edge grippers separated by about 120 degree angles.

7. The method of claim 1, wherein the second set of edge grippers includes three edge grippers separated by about 120 degree angles.

\* \* \* \* \*